United States Patent
Matsuda (10) Patent No.: US 7,030,696 B2
(45) Date of Patent: Apr. 18, 2006

(54) DIFFERENTIAL AMPLIFIER AND SEMICONDUCTOR DEVICE

(75) Inventor: Akiyoshi Matsuda, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 71 days.

(21) Appl. No.: 10/895,096

(22) Filed: Jul. 21, 2004

(65) Prior Publication Data

US 2005/0184804 A1   Aug. 25, 2005

(30) Foreign Application Priority Data

Feb. 24, 2004   (JP)   ............................. 2004-048315

(51) Int. Cl.
*H03F 3/45*   (2006.01)
*H03F 3/26*   (2006.01)

(52) U.S. Cl. ...................... 330/253; 330/255; 330/257; 330/267

(58) Field of Classification Search ................ 330/253, 330/255, 257, 267
See application file for complete search history.

(56) References Cited

U.S. PATENT DOCUMENTS

| | | | |
|---|---|---|---|
| 4,912,393 A | * | 3/1990 | Anderson et al. ........... 323/313 |
| 5,471,665 A | * | 11/1995 | Pace et al. ................ 455/343.2 |
| 6,121,836 A | * | 9/2000 | Vallencourt .................. 330/253 |
| 6,411,162 B1 | * | 6/2002 | Minamizaki et al. ....... 330/255 |

FOREIGN PATENT DOCUMENTS

JP    2002-043871    2/2002

* cited by examiner

*Primary Examiner*—Patricia Nguyen
(74) *Attorney, Agent, or Firm*—Arent Fox PLLC

(57) ABSTRACT

A differential amplifier for amplifying an input signal at a constant amplification rate regardless of fluctuation in the center voltage of the input signal. The differential amplifier includes a first differential pair operated when a complementary input signal is greater than or equal to an intermediate level between power supplies. A second differential pair is operated when the complementary input signal is less than or equal to an intermediate level of the power supplies. A current synthesizing circuit synthesizes output currents of the first and second differential pairs to generate output voltage. An output current offset circuit offsets a current corresponding to the output current of one of the differential pairs based on the complementary input signal so that the output voltage becomes the output current of one of the first and second differential pairs.

21 Claims, 5 Drawing Sheets

DIFFERENTIAL AMPLIFIER AND SEMICONDUCTOR DEVICE

CROSS-REFERENCE TO RELATED APPLICATIONS

This application is based upon and claims the benefit of priority from the prior Japanese Patent Application No. 2004-048315, filed on Feb. 24, 2004, the entire contents of which are incorporated herein by reference.

BACKGROUND OF THE INVENTION

The present invention relates to a semiconductor device, and more particularly, to a semiconductor device incorporating a rail-to-rail amplifier (differential amplifier) used as an interface circuit complying with IEEE 1394.b.

In an interface circuit complying with IEEE 1394.b, if the input voltage range is 0 to 3.0 V, for example, it is determined that a signal does not exist when an input signal has an amplitude of less than 80 mV, and determined that a signal exists when an input signal has an amplitude of 200 mV or greater. To satisfy such a specification, a rail-to-rail amplifier is used in an input stage circuit of an interface circuit. The rail-to-rail amplifier includes a differential pair operated when an input signal has a relatively high potential in an input voltage range and a further differential pair operated when an input signal has a low potential in the input voltage range. Thus, the rail-to-rail amplifier functions stably when an input voltage fluctuates between a high potential power supply and a low potential power supply.

Figure 1:
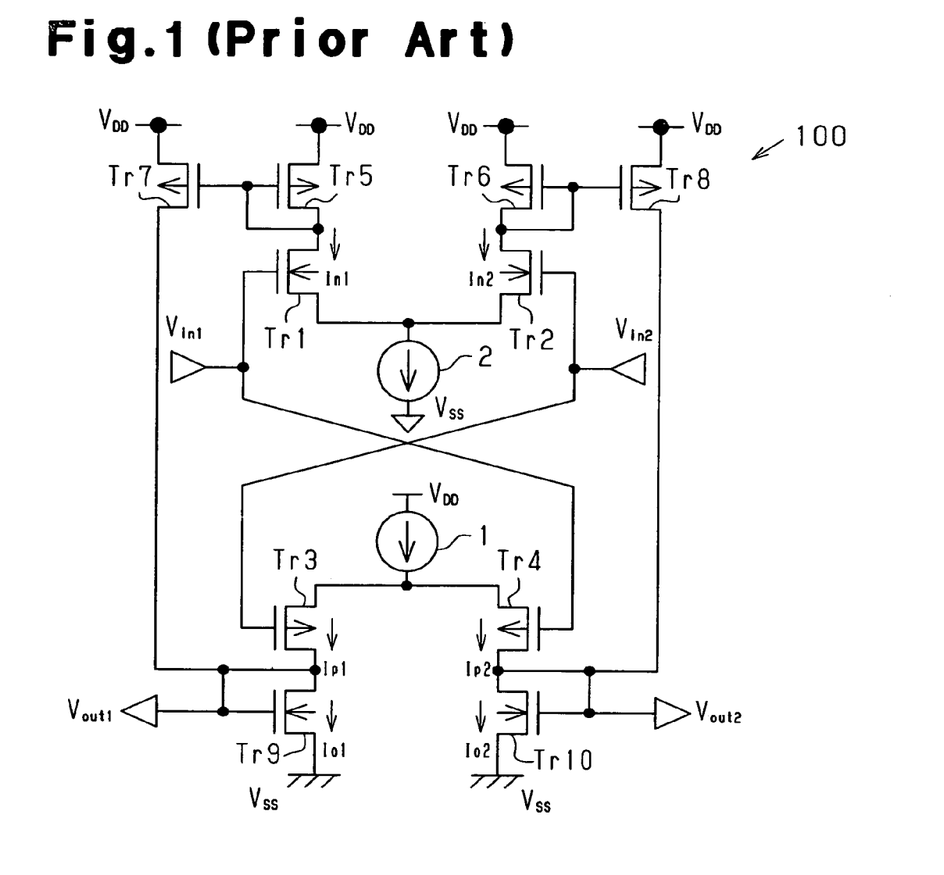
FIG. 1 is a circuit diagram of a rail-to-rail amp in the prior art.

FIG. 1 is a circuit diagram showing a prior art rail-to-rail amplifier (amp) 100. An input differential pair is configured by n-channel MOS transistors Tr1 and Tr2. An input signal Vin1 is provided to the gate of the transistor Tr1, and an input signal Vin2 is provided to the gate of the transistor Tr2.

Figure 3A:
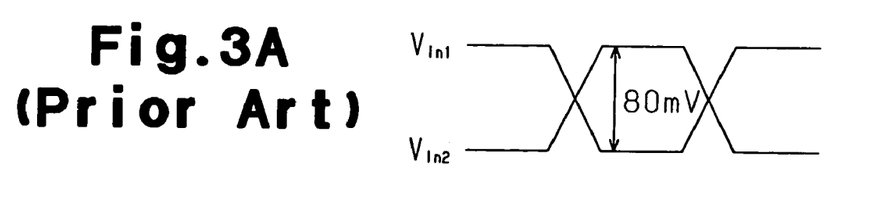
FIG. 3A is a chart showing an input voltage waveform.
Figure 3B:
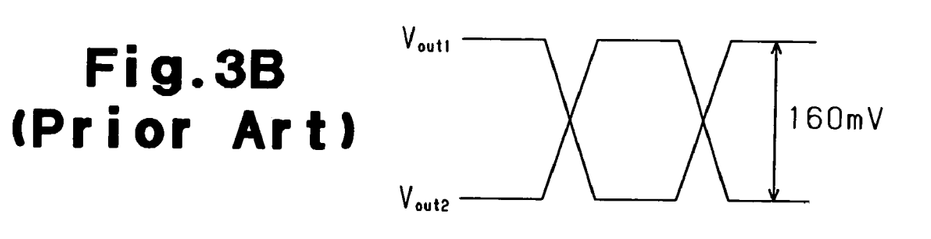
FIGS. 3B and 3C are charts showing an output voltage waveform.

Further, an input differential pair is configured by p-channel MOS transistors Tr3 and Tr4. The input signal Vin2 is provided to the gate of the transistor Tr3, and the input signal Vin1 is provided to the gate of the transistor Tr4. Referring to FIG. 3A, the input signals Vin1 and Vin2 are complementary signals having amplitudes of about, for example, 80 mV.

The sources of the transistors Tr3 and Tr4 are connected to a current source 1, which is further connected to a power supply VDD. Accordingly, operation currents Ip1 and Ip2 corresponding to the input signals Vin2 and Vin1 flow through the transistors Tr3 and Tr4, respectively.

The sources of the transistors Tr1 and Tr2 are connected to a current source 2, which is further connected to a power supply Vss. The drain of the transistor Tr1 is connected to the drain and gate of a p-channel MOS transistor Tr5. The source of the transistor Tr5 is connected to the power supply VDD. The drain of the transistor Tr2 is connected to the drain and gate of a p-channel MOS transistor Tr6. The source of the transistor Tr6 is connected to the power supply VDD. Accordingly, operation currents In1 and In2 corresponding to the input signals Vin1 and Vin2 flow through the transistors Tr1 and Tr2, respectively.

The gate of the transistor Tr5 is connected to the gate of a p-channel MOS transistor Tr7. The source of the transistor Tr7 is connected to the power supply VDD. The drain of the transistor Tr7 is connected to the drain and gate of an n-channel MOS transistor Tr9. The drain of the transistor Tr9 is connected to the drain of the transistor Tr3. The source of the transistor Tr9 is connected to the power supply Vss.

The gate of the transistor Tr6 is connected to the gate of a p-channel MOS transistor Tr8. The source of the transistor Tr8 is connected to the power supply VDD. The drain of the transistor Tr8 is connected to the drain and gate of an n-channel MOS transistor Tr10. The drain of the transistor Tr10 is connected to the drain of the transistor Tr4. The source of the transistor Tr10 is connected to the power supply Vss.

Accordingly, the transistors Tr5 and Tr7 and the transistors Tr6 and Tr8 perform a current mirror operation. The drain current of the transistor Tr7 flows through the transistor Tr9, and the drain current of the transistor Tr8 flows through the transistor Tr10.

Figure 2:
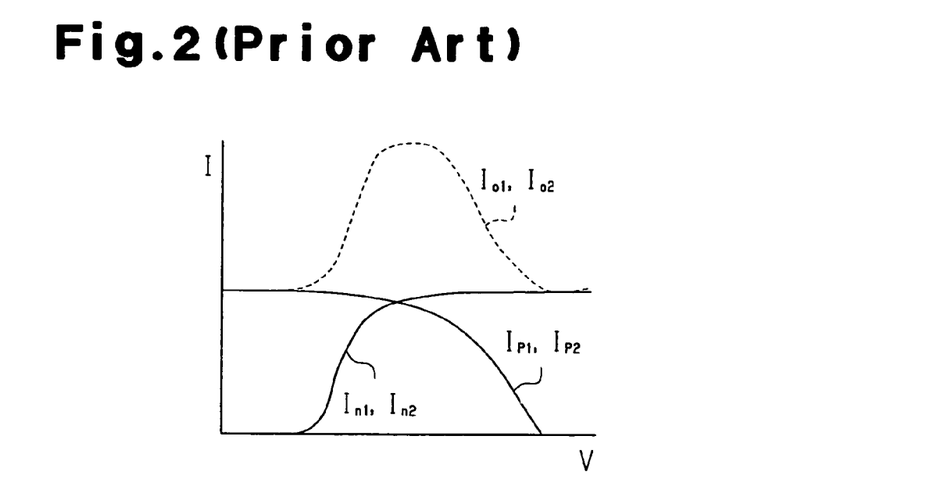
FIG. 2 is a graph showing the relationship between the center voltage of an input signal and the operational current in the rail-to-rail amp of FIG. 1.

Referring to FIG. 2, in the rail-to-rail amp 100, when the center voltage of the input signals Vin1 and Vin2 is near the power supply VDD, the input differential pair configured mainly by the n-channel MOS transistors, or the transistors Tr1 and Tr2, is operated. Current corresponding to the operation currents In1 and In2 associated with the transistors Tr1 and Tr2 flow through the transistors Tr9 and Tr10 as output currents Io1 and Io2, respectively.

When the center voltage of the input signals Vin1 and Vin2 is near the power supply Vss, the input differential pair configured mainly by the p-channel MOS transistors, or the transistors Tr3 and Tr4, is operated. Current corresponding to the operation currents Ip1 and Ip2 associated with the transistors Tr3 and Tr4 flow through the transistors Tr9 and Tr10 as the output currents Io1 and Io2, respectively.

For example, based on the size of the transistors Tr9 and Tr10 and the size of other transistors, the amplification rate may be set to "2". In such a case, when the rail-to-rail amp 100 is supplied with the input signals Vin1 and Vin2 having amplitudes of 80 mV as shown in FIG. 3A, output signals Vout1 and Vout 2 having amplitudes of 160 mV are output from the drains of the transistors Tr9 and Tr10, respectively. In this manner, the transistors Tr5 and Tr7 (current mirror circuit), the transistors Tr6 and Tr8 (current mirror circuit), and the transistors Tr9 and Tr10 synthesize the operation current of each input differential pair and function as a current synthesizing circuit that generates the output voltages Vout1 and Vout2.

Figure 3C:
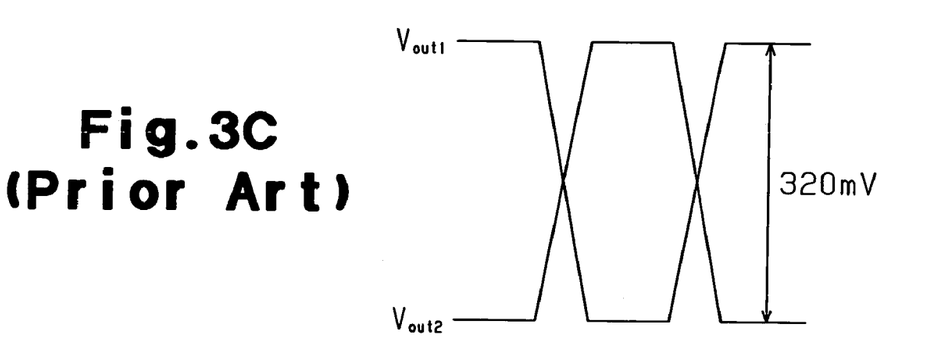

As the center voltage of the input signals Vin1 and Vin2 approaches an intermediate level between the power supply VDD and the power supply Vss, the transistors Tr1 and Tr2 in addition to the transistors Tr3 and Tr4 are operated. Thus, the output currents Io1 and Io2 flowing through the transistors Tr9 and Tr10 increase. When the center voltage of the input signals Vin1 and Vin2 reach the intermediate level between the power supply VDD and the power supply Vss, the transistors Tr1 and TR2 and the transistors Tr3 and Tr4 are operated in a substantially saturated state. Thus, referring to FIG. 2, the maximum output currents Io1 and Io2 flow through the transistors Tr9 and Tr10. In this case, the amplitudes of the output voltages increases to 320 mV, as shown in FIG. 3C, even though the amplitudes of the input signals Vin1 and Vin2 is 80 mV.

In this manner, the amplification rate of the rail-to-rail amp 100 increases when the center voltage of the input signals Vin1 and Vin2 is near the intermediate level between the power supply VDD and the power supply Vss. Accordingly, in this case, even if the amplitudes of the input signals Vin1 and Vin2 are less than 80 mV, due to the increase in the amplitudes of the output voltages Vout1 and Vout2, the circuit in the following stage may determine that a signal exists based on the output voltages Vout1 and Vout2 respectively corresponding to the input signals Vin1 and Vin2, which are less than 80 mV.

Figure 4:
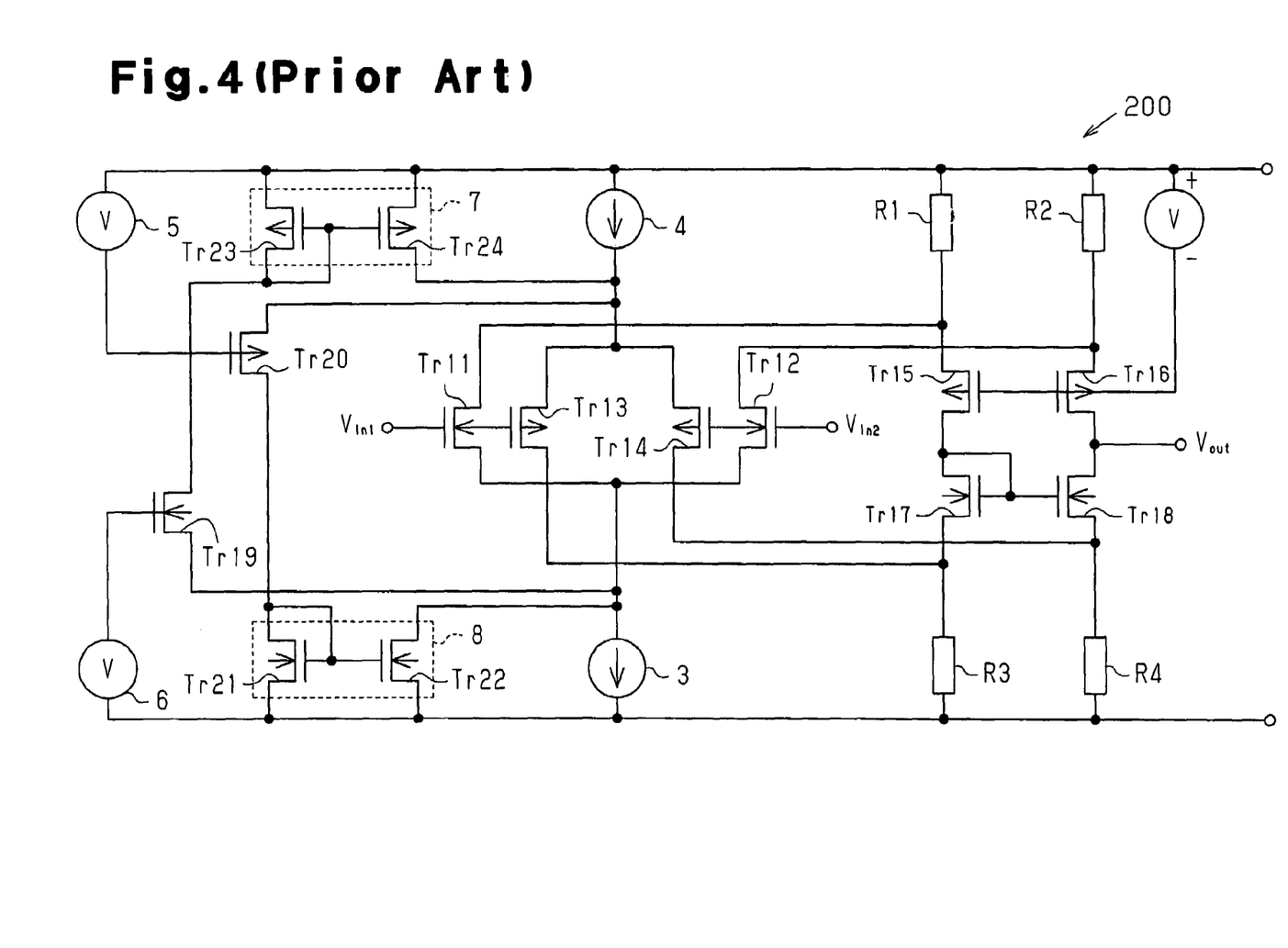
FIG. 4 is a circuit diagram showing an input stage circuit in the prior art.

FIG. 4 is a circuit diagram of an input stage circuit 200 which includes a means for suppressing output voltage fluctuation with respect to fluctuations of the center voltage of the input signals Vin1 and Vin2. In the input stage circuit 200, n-channel MOS transistors Tr11 and Tr12 configure an input differential pair, and p-channel MOS transistors Tr13 and Tr14 configure a further input differential pair. The transistors Tr11 and Tr12 are supplied with operation current from a current source 3. The transistors Tr13 and Tr14 are supplied with operation current from a current source 4.

Transistors Tr15 to Tr18 and resistors R1 to R4 configure an output circuit that synthesizes the operation currents of the input differential pairs and generate an output voltage Vout. The input stage circuit 200 further includes a tail current controller provided with an n-channel MOS transistor Tr19 and a p-channel MOS transistor Tr20, each of which functions as a current switch, constant voltage sources 5 and 6, and current mirror circuits 7 and 8. The tail current controller suppresses fluctuation of the output voltage Vout relative to fluctuations in the power supply voltage of the input signals Vin1 and Vin2.

The transistor Tr20 is activated and the current mirror circuit 8 is operated when the center voltage of the input signals Vin1 and Vin2 reaches a level close to the power supply VDD. The size of n-channel MOS transistors Tr21 and Tr22, which configure the current mirror circuit 8, is set at 1:3. Thus, current that is three times greater than the drain current flowing through the transistor Tr21 flows through the transistor Tr22, or the transistors Tr11 and Tr12.

The transistor Tr19 is activated and the current mirror 7 is operated when the center voltage of the input signals Vin1 and Vin2 reaches a level close to the power supply Vss. The size of p-channel MOS transistors Tr23 and Tr24, which configure the current mirror circuit 7, is set at 1:3. Thus, current that is three times greater than the drain current flowing through the transistor Tr23 flows through the transistor Tr24, or the transistors Tr13 and Tr14. Such operation levels the operation current flowing through the transistors Tr11 to Tr14 with respect to fluctuations in the center voltage of the input signals Vin1 and Vin2. This suppresses fluctuation of the output voltage Vout.

Japanese Laid-Open Patent Publication No. 2002-43871 describes a rail-to-rail amp that prevents deficient operations resulting from fluctuations in the input signal and that suppresses fluctuation of the output voltage relative to fluctuations in the center voltage of the input signal if there is no potential difference between input signals provided to a differential pair.

SUMMARY OF THE INVENTION

In the rail-to-rail amp of FIG. 1, the amplitudes of the output voltages Vout1 and Vout2 fluctuate when the center voltage of the input signals Vin1 and Vin2 fluctuate between the power supply VDD and the power supply Vss. Accordingly, even if an input signal has an amplitude that should result in a determination that a signal does not exist, an increase in the amplitude of the output voltage would cause an input signal having that output voltage to result in a determination that a signal exists.

In the input stage circuit shown in FIG. 4, regardless of fluctuations in the center voltage of the input signals Vin1 and Vin2, the operation current flowing through an input differential pair is leveled to suppress transconductance fluctuation. However, the size ratio of the transistors configuring the current mirror circuit is predetermined. Thus, the operation current flowing through the current mirror circuit cannot be completely leveled. Accordingly, fluctuations in the output voltage relative to fluctuations in the center voltage of the input signal cannot be completely suppressed. Further, the current supplied from the current mirror circuit to the input differential pair is set in accordance with the current value obtained when the center voltage of the input signals Vin1 and Vin2 is equal to the intermediate level of the power supplies VDD and Vss, that is, when the total sum of the operation currents flowing through the input differential pair is maximum. Accordingly, the operation current flowing through the input differential pair constantly increases. This increases current consumption.

Further, Japanese Laid-Open Patent Publication No. 2002-43871 does not describe suppressing amplitude fluctuations of the output voltage based on fluctuations of the voltage level of the input signal.

The present invention provides a differential amplifier that amplifies an input signal by a constant amplification rate regardless of fluctuations in the center voltage of the input signal.

One aspect of the present invention is a differential amplifier including a first differential circuit for generating a first operation current in response to an input signal. A second differential circuit generates a second operation current in response to the input signal. A current synthesizing circuit, connected to the first and second differential circuits, synthesizes the first and second operation currents and generates output voltage. An output current offset circuit, connected to the current synthesizing circuit, offsets a current corresponding to one of the first and second operation currents based on the input signal.

Another aspect of the present invention is a differential amplifier including a first differential circuit for generating a first operation current in response to an input signal. A second differential circuit generates a second operation current in response to the input signal. A current synthesizing circuit, connected to the first and second differential circuits, synthesizes the first and second operation currents and generates output voltage. A third differential circuit generates a third operation current corresponding to the second operation current in response to the input signal. A current supplying circuit, connected to the first differential circuit and the third differential circuit, supplies the first differential circuit with the third operation current and offsets the first operation current with the third operation current.

A further aspect of the present invention is a differential amplifier including a first differential circuit for generating a first operation current in response to an input signal. A second differential circuit generates a second operation current in response to the input signal. A current synthesizing circuit, connected to the first and second differential circuits, synthesizes the first and second operation currents and generates output voltage. A third differential circuit generates a third operation current corresponding to the first operation current in response to the input signal. A current supplying circuit, connected to the second differential circuit and the third differential circuit, supplies the second differential circuit with the third operation current and offsets the second operation current with the third operation current.

A further aspect of the present invention is a semiconductor device including a differential amplifier for amplifying an input signal. The differential amplifier includes a first differential circuit for generating a first operation current in response to the input signal. A second differential circuit generates a second operation current in response to the input signal. A current synthesizing circuit, connected to the first and second differential circuits, synthesizes the first and second operation currents and generates output voltage. An output current offset circuit, connected to the current synthesizing circuit, offsets a current corresponding to one of the first and second operation currents based on the input signal.

A further aspect of the present invention is a semiconductor device including a differential amplifier for amplifying an input signal. The differential amplifier includes a first differential circuit for generating a first operation current in response to the input signal. A second differential circuit generates a second operation current in response to the input signal. A current synthesizing circuit, connected to the first and second differential circuits, synthesizes the first and second operation currents and generates output voltage. A third differential circuit generates a third operation current corresponding to the second operation current in response to the input signal. A current supplying circuit, connected to the first differential circuit and the third differential circuit, supplies the first differential circuit with the third operation current and offsets the first operation current with the third operation current.

A further aspect of the present invention is a semiconductor device including a differential amplifier for amplifying an input signal. The differential amplifier includes a first differential circuit for generating a first operation current in response to the input signal. A second differential circuit generates a second operation current in response to the input signal. A current synthesizing circuit, connected to the first and second differential circuits, synthesizes the first and second operation currents and generates output voltage. A third differential circuit generates a third operation current corresponding to the first operation current in response to the input signal. A current supplying circuit, connected to the second differential circuit and the third differential circuit, supplies the second differential circuit with the third operation current and offsets the second operation current with the third operation current.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

In the drawings, like numeral are used for like elements throughout.

Figure 5:
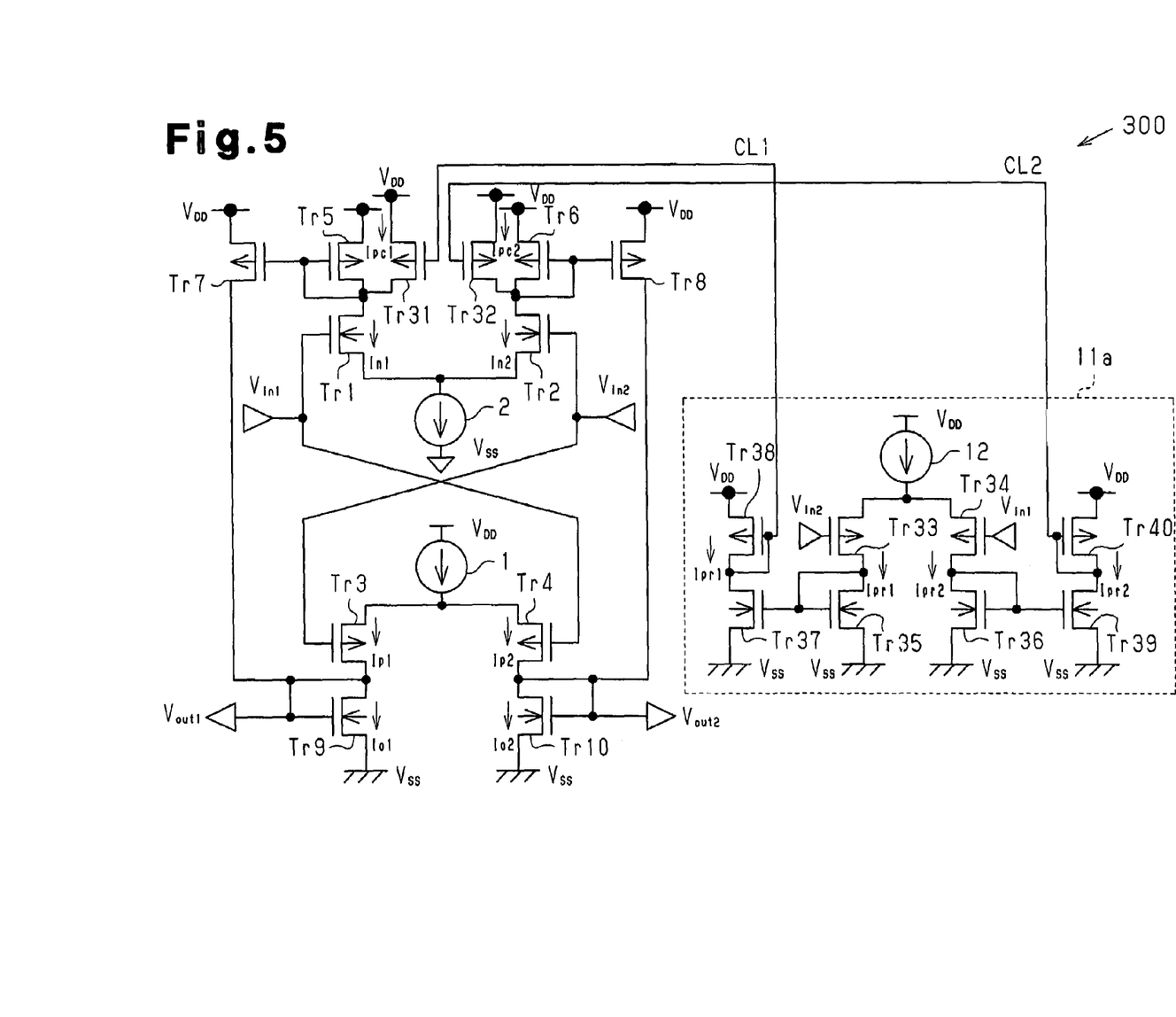
FIG. 5 is a circuit diagram of a differential amplifier according to a first embodiment of the present invention.

A differential amplifier (rail-to-rail amp) 300 according to a first embodiment of the present invention will now be discussed with reference to FIG. 5. The differential amplifier 300 is used as an interface circuit incorporated in a semiconductor device. Transistors Tr1 to Tr10 and current sources 1 and 2 are identical to those shown in FIG. 1. The output transistors Tr9 and Tr10, which function as a current synthesizing circuit, are connected between an input differential pair, which is configured by the p-channel transistors Tr3 and Tr4, and a power supply Vss (low potential power supply). The differential amplifier 300 includes an output current offset circuit, which maintains the output current flowing through the output transistors Tr9 and Tr10 at a constant value regardless of fluctuations in the center voltage of an input signal. The output current offset circuit includes p-channel MOS transistors Tr31 and Tr32 and a control signal generation circuit 11a.

The source of the p-channel MOS transistor Tr31 is connected to a power supply VDD (high potential power supply), and the drain of the transistor Tr31 is connected to the drain of the transistor Tr5. Accordingly, the transistor Tr31 is connected parallel to the transistor Tr5. The source of the p-channel MOS transistor Tr32 is connected to the power supply VDD, and the drain of the transistor Tr32 is connected to the drain of the transistor Tr6. Accordingly, the transistor Tr32 is connected parallel to the transistor Tr6.

The gate of the transistor Tr31 is provided with a control signal CL1 from the control signal generation circuit 11a. The gate of the transistor Tr32 is provided with a control signal CL2 from the control signal generation circuit 11a. When the center voltage of the input signals Vin1 and Vin2 reaches the vicinity of an intermediate level between the power supplies VDD and Vss, this would increase the output currents Io1 and Io2 flowing through the output transistors Tr9 and Tr10. The control signals CL1 and CL2 are generated to offset such current increase.

The control signal generation circuit 11a will now be discussed. The sources of p-channel MOS transistors Tr33 and Tr34 are connected to a current source 12, which is further connected to the power supply VDD. The gate of the transistor Tr33 is provided with the input signal Vin2, and the gate of the transistor Tr34 is provided with the input signal Vin1.

The drain of the transistor Tr33 is connected to the drain and the gate of an n-channel MOS transistor Tr35 and to the gate of an n-channel MOS transistor Tr37. The sources of the transistors Tr35 and Tr37 are connected to the power supply Vss. The transistors Tr35 and Tr37 function as a current mirror circuit. The size of the transistor Tr33 is substantially the same as that of the transistor Tr3. When the input signal Vin2 is applied to the gates of the transistors Tr3 and Tr33, an operation current Ipr1, which is substantially the same as the operation current Ip1 flowing through the transistor Tr3, flows through the transistors Tr33, Tr35, and Tr37.

The drain of the transistor Tr37 is connected to the drain and the gate of a p-channel MOS transistor Tr38. The source of the transistor Tr38 is connected to the power supply VDD. Accordingly, the operation current Ipr1 is supplied to the transistor Tr37 from the transistor Tr38 in accordance with the operation of the transistor Tr37.

The gate of the transistor Tr38 is connected to the gate of the transistor Tr31. Accordingly, the gate voltage of the transistor Tr38 is supplied as the control signal CL1 to the transistor Tr31, and the transistors Tr38 and Tr31 perform a current mirror operation. Due to this configuration, when the operation current Ipr1 flows through the transistor Tr33 in response to the input signal Vin2, the current mirror operation of the transistors Tr35 and Tr37 causes the same operation current Ipr1 to flow through the transistor Tr38. As a result, the current mirror operation of the transistors Tr38 and Tr31 cause an operation current Ipc1, which is substantially equivalent to the operation current Ipr1, to flow through the transistor Tr31.

The drain of the transistor Tr34 is connected to the drain and the gate of an n-channel MOS transistor Tr36 and to the gate of an n-channel MOS transistor Tr39. The sources of the transistors Tr36 and Tr39 are connected to the power supply Vss. The transistors Tr36 and Tr39 function as a current mirror circuit. The size of the transistor Tr34 is substantially the same as that of the transistor Tr4. When the input signal Vin1 is applied to the gates of the transistors Tr4 and Tr34, an operation current Ipr2, which is substantially the same as the operation current Ip2 flowing through the transistor Tr4, flows through the transistors Tr34, Tr36, and Tr39.

The drain of the transistor Tr39 is connected to the drain and the gate of a p-channel MOS transistor Tr40. The source of the transistor Tr40 is connected to the power supply. VDD. Accordingly, the operation current Ipr2 is supplied to the transistor Tr39 from the transistor Tr40 in accordance with the operation of the transistor Tr39.

The gate of the transistor Tr40 is connected to the gate of the transistor Tr32. Accordingly, the gate voltage of the transistor Tr40 is supplied as the control signal CL2 to the transistor Tr32, and the transistors Tr40 and Tr32 perform a current mirror operation. Due to this configuration, when the operation current Ipr2 flows through the transistor Tr34 in response to the input signal Vin1, the current mirror operation of the transistors Tr36 and Tr39 causes the same operation current Ipr2 to flow through the transistor Tr40. As a result, the current mirror operation of the transistors Tr40 and Tr32 cause an operation current Ipc2, which is substantially equivalent to the operation current Ipr2, to flow through the transistor Tr32.

The transistors Tr33 and Tr34 function as an offset current generation circuit, and the control signal generation circuit 11*a* excluding the transistors Tr33 and Tr34, that is, the transistors Tr31, Tr32, and Tr35 to Tr40 function as an offset current supplying circuit together with the transistors Tr31 and Tr32.

The operation of the differential amplifier 300 will now be discussed.

When the center voltage of the input signals Vin1 and Vin2 is at the intermediate level between the power supply VDD and the power supply Vss, the input differential pair configured by the transistors Tr1 and Tr2 and the input differential pair configured by the transistors Tr3 and Tr4 operate in a saturated state. Further, the operation currents In1 and In2 of the transistors Tr1 and Tr2 and the operation currents Ip1 and Ip2 of the transistors Tr3 and Tr4 are saturated.

In this state, the operation currents Ipr1 and Ipr2 respectively flowing through the transistors Tr33 and Tr34 are saturated currents, and the same operation currents Ipr1 and Ipr2 respectively flow through the transistors Tr38 and Tr40. As a result, the same operation currents Ipc1 and Ipc2 (offset current) respectively flow through the transistors Tr31 and Tr32. The operation currents Ipc1 and Ipc2 are substantially the same as the operation currents In1 and In2 respectively flowing through the transistors Tr1 and Tr2. This increases the potential at the gates of the transistors Tr5 and Tr7 (first current mirror circuit) and the gates of the transistors Tr6 and Tr8 (first current mirror circuit). Thus, drain current does not flow through each of the first current mirror circuits. As a result, only the operation current Ip1, which flows through the transistor Tr3, flows as the output current Io1 through the transistor Tr9, which generates the output voltage Vout1. Further, only the operation current Ip2, which flows through the transistor Tr4, flows as the output current Io2 through the transistor Tr10, which generates the output voltage Vout2.

When the center voltage of the input signals Vin1 and Vin2 decreases and becomes less than the intermediate level between the power supply VDD and the power supply Vss, the transistors Tr33 and Tr34 are maintained in a saturation range, currents substantially equal to the currents In1 and In2 flow through the transistors Tr31 and Tr32, and null operation current flows through the transistors Tr7 and Tr8. Accordingly, only the operation current Ip1, which flows through the transistor Tr3, flows as the output current Io1 through the transistor Tr9. Further, only the operation current Ip2, which flows through the transistor Tr4, flows as the output current Io2 through the transistor Tr10.

When the center voltage of the input signals Vin1 and Vin2 increases and becomes greater than the intermediate level between the power supply VDD and the power supply Vss, the transistors Tr33 and Tr34 are operated in a non-saturation range. Further, the transistors Tr1 and Tr2 are operated in a saturation range. As a result, operation currents Ipr1 and Ipr2 (i.e., operation currents Ipc1 and Ipc2), which are smaller than the operation currents In1 and In2 of the transistors Tr1 and Tr2, respectively flow through the transistors Tr33 and Tr34 (i.e., transistors Tr31 and Tr32). Therefore, operation current (In1-Ipc1) flows through the transistors Tr7, and operation current (In2-Ipc2) flows through the transistor Tr8. Further, the operation currents Ip1 and Ip2 of the transistors Tr3 and Tr4 become substantially equal to the operation currents Ipc1 and Ipc2, respectively. Accordingly, only the current that corresponds to the operation current In1 flowing through the transistor Tr1 flows as the output current Io1 through the transistor Tr9. Further, only the current that corresponds to the operation current In2 flowing through the transistor Tr2 flows as the output current Io2 through the transistor Tr10.

The differential amplifier 300 has the advantages described below.

(1) Even if the center voltage of the input signals Vin1 and Vin2 fluctuate in the range between the power supply VDD and the power supply Vss, the output currents Io1 and Io2 respectively corresponding to the operation currents In1 and In2 of the transistors Tr1 and Tr2 or the operation currents Ip1 and Ip2 of the transistors Tr3 and Tr4 flow through the output transistors Tr9 and Tr10. Accordingly, the amplification rate of the output voltages Vout1 and Vout2 is maintained at a constant value regardless of the center voltage of the input signals Vin1 and Vin2.

(2) When the center voltage of the input signals Vin1 and Vin2 is the intermediate level between the power supply VDD and the power supply Vss, the control signal generation circuit 11*a* and the operation of the transistors Tr31 and Tr32, which are responsive to the control signals CL1 and CL2 from the control signal generation circuit 11*a*, prevent the operation currents of the n-channel transistors Tr1 and Tr2 from flowing through the output transistors Tr9 and Tr10. That is, the operation currents of the transistors Tr1 and Tr2 are offset by the operation currents Ipc1 and Ipc2 respectively flowing through the transistors Tr31 and Tr32. This prevents the amplitude of the output voltage Vout1 and Vout2 from being increased.

(3) When the center voltage of the input signals Vin1 and Vin2 is less than the intermediate level between the power supply VDD and the power supply Vss, the operation currents of the transistors Tr1 and Tr2 are offset. Further, the output voltages Vout1 and Vout2 are generated based on only the operation currents Ip1 and Ip2 flowing through the p-channel side input differential transistors Tr3 and Tr4.

(4) When the center voltage of the input signals Vin1 and Vin2 is greater than the intermediate level between the power supply VDD and the power supply Vss, the operation currents of the p-channel side input differential transistors Tr3 and Tr4 are offset. Further, the output voltages Vout1 and Vout2 are generated based on only the currents corresponding to the operation currents In1 and In2 flowing through the n-channel side input differential transistors Tr1 and Tr2.

(5) The size of the p-channel MOS transistor and the size of the n-channel MOS transistor configuring the control signal generation circuit 11a are substantially equal to the size of the p-channel MOS transistors and the size of the n-channel MOS transistors excluding the output transistors Tr9 and Tr10. Accordingly, a current offsetting operation is surly and easily performed.

(6) The operation currents Ipr1 and Ipr2 consumed by the control signal generation circuit 11a increases only when the center voltage of the input signals Vin1 and Vin2 fluctuates within a range from the power supply Vss to the intermediate level between the power supply VDD and the power supply Vss. This reduces current consumption in comparison with the prior art example shown in FIG. 4.

Figure 6:
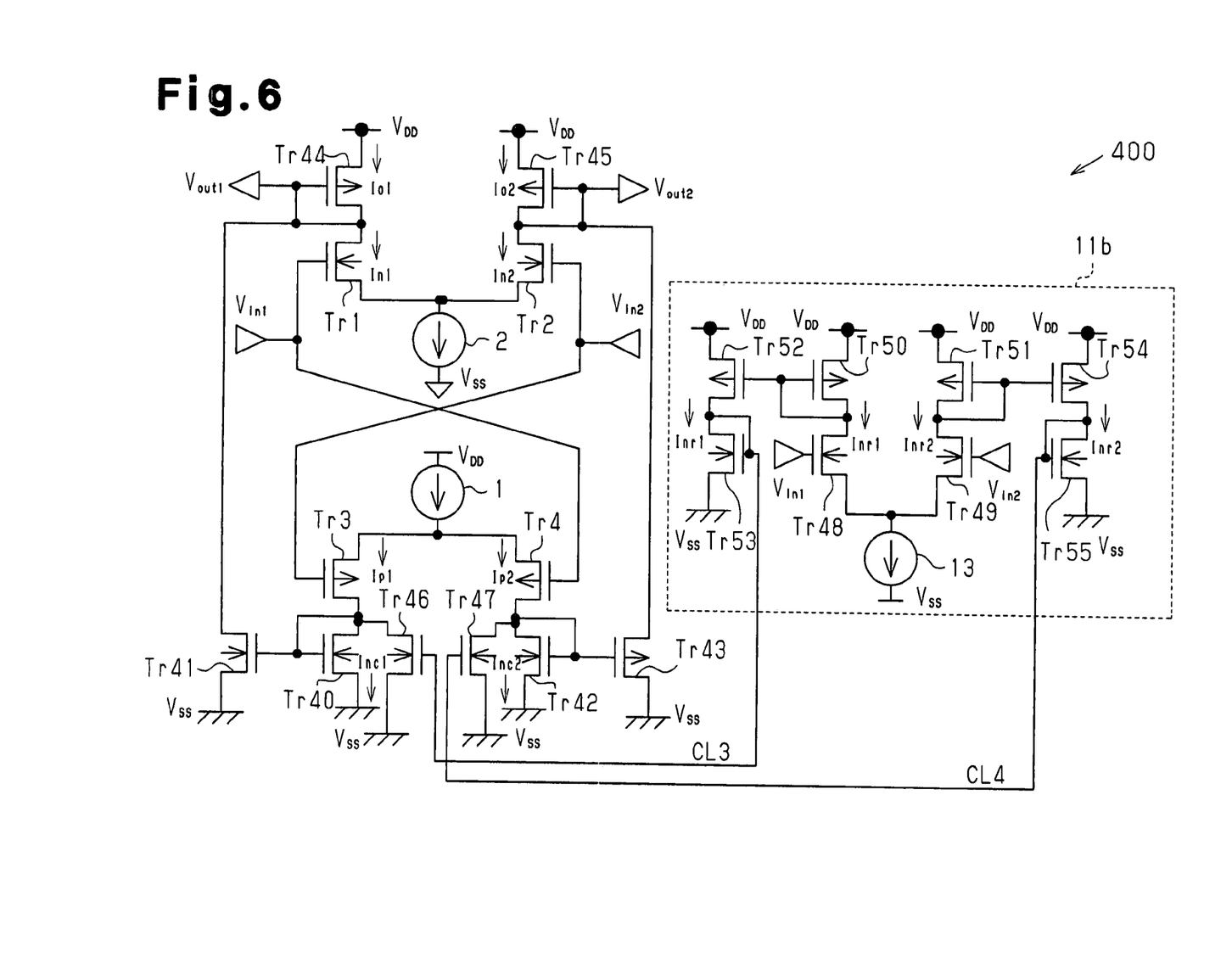
FIG. 6 is a circuit diagram of a differential amplifier according to a second embodiment of the present invention.

FIG. 6 is a circuit diagram of a differential amplifier (rail-to-rail amp) 400 according to a second embodiment of the present invention. In the second embodiment, a current synthesizing circuit is arranged between an n-channel side input differential pair and the power supply VDD. Further, an input differential pair of a control signal generation circuit 11b is configured by n-channel MOS transistors in correspondence with the current synthesizing circuit.

The sources of transistors Tr1 and Tr2 are connected to a current source 2. The current source 2 is connected to a power supply Vss. The sources of transistors Tr3 and Tr4 are connected to a current source 1. The current source 1 is connected to a power supply VDD. The drain of the transistor Tr3 is connected to the drain and the gate of a p-channel MOS transistor Tr40. The source of the transistor Tr40 is connected to the power supply Vss. The drain of the transistor Tr4 is connected to the drain and the gate of an n-channel MOS transistor Tr42. The source of the transistor Tr42 is connected to the power supply Vss.

The gate of the transistor Tr40 is connected to the gate of an n-channel MOS transistor Tr41. The source of the transistor Tr41 is connected to the power supply Vss. The drain of the transistor Tr41 is connected to the drain and the gate of an output transistor Tr44, which is configured by a p-channel MOS transistor. The drain of the transistor Tr44 is connected to the drain of the transistor Tr1, and the source of the transistor Tr44 is connected to the power supply VDD.

The gate of the transistor Tr42 is connected to the gate of an n-channel MOS transistor Tr43. The source of the transistor Tr43 is connected to the power supply Vss. The drain of the transistor Tr43 is connected to the drain and the gate of an output transistor Tr45, which is configured by a p-channel MOS transistor. The drain of the transistor Tr45 is connected to the drain of the transistor Tr2, and the source of the transistor Tr45 is connected to the power supply VDD.

The pair of the transistors Tr40 and Tr41 and the pair of the transistors Tr42 and Tr43 each perform a current mirror operation. The drain current of the transistor Tr41 flows through the transistor Tr44. The drain current of the transistor Tr43 flows through the transistor Tr45. Output voltages Vout1 and Vout2 are respectively output from the drains of the transistors Tr44 and Tr45.

An output current offset circuit configured by n-channel MOS transistors Tr46 and Tr47 and the control signal generation circuit 11b will now be discussed.

The source of the n-channel MOS transistor Tr46 is connected to the power supply Vss. The drain of the transistor Tr46 is connected to the drain of the transistor Tr40. Accordingly, the transistor Tr46 is connected parallel to the transistor Tr40. The source of the n-channel MOS transistor Tr47 is connected to the power supply Vss. The drain of the transistor Tr47 is connected to the drain of the transistor Tr42. Accordingly, the transistor Tr47 is connected parallel to the transistor Tr42. The gate of the transistor Tr46 is provided with a control signal CL3, which is generated by the control signal generation circuit 11b. The gate of the transistor Tr47 is provided with a control signal CL4, which is generated by the control signal generation circuit 11b.

In the control signal generation circuit 11b, the sources of n-channel MOS transistors Tr48 and Tr49 are each connected to a current source 13. The current source 13 is connected to the power supply Vss. The gate of the transistor Tr48 is provided with an input signal Vin1. The gate of the transistor Tr49 is provided with an input signal Vin2.

The drain of the transistor Tr48 is connected to the drain and the gate of a p-channel MOS transistor Tr50 and to the gate of a p-channel MOS transistor Tr52. The sources of the transistors Tr50 and Tr52 are connected to the power supply VDD. Accordingly, the transistors Tr50 and Tr52 operate as a current mirror circuit. Further, the size of the transistor Tr48 is the same as that of the transistor Tr1. In response to the input signal Vin1, operation current Inr1, which is substantially equivalent to the operation current In1 that flows through the transistor Tr1, flows through the transistors Tr48, Tr50, and Tr52.

The drain of the transistor Tr52 is connected to the drain and the gate of an n-channel MOS transistor Tr53. The source of the transistor Tr53 is connected to the power supply Vss. Accordingly, based on the operation of the transistor Tr52, the operation current Inr1 flows from the transistor Tr52 to the transistor Tr53. The gate of the transistor Tr53 is connected to the gate of the transistor Tr46. Thus, the gate voltage of the transistor Tr53 is provided as the control signal CL3 to the gate of the transistor Tr46, and the transistors Tr53 and Tr46 perform a current mirror operation.

When the operation current Inr1 flows through the transistor Tr48 in response to the input signal Vin1, the current mirror operation of the transistors Tr50 and Tr52 cause the same operation current Inr1 to flow through the transistor Tr53. Then, the current mirror operation of the transistors Tr53 and Tr46 cause the operation current Inc1, which is substantially the same as the operation current Inr1, to flow through the transistor Tr46.

The drain of the transistor Tr49 is connected to the drain and the gate of a p-channel MOS transistor Tr51 and to the gate of a p-channel MOS transistor Tr54. The sources of the transistors Tr51 and Tr54 are connected to the power supply VDD. Accordingly, the transistors Tr51 and Tr54 operate as a current mirror circuit. Further, the size of the transistor Tr49 is the same as that of the transistor Tr2. In response to the input signal Vin2, operation current Inr2, which is substantially equivalent to the operation current In2 that flows through the transistor Tr2, flows through the transistors Tr49, Tr51, and Tr54.

The drain of the transistor Tr54 is connected to the drain and the gate of an n-channel MOS transistor Tr55. The source of the transistor Tr55 is connected to the power supply Vss. Accordingly, based on the operation of the transistor Tr54, the operation current Inr2 flows from the transistor Tr54 to the transistor Tr55. The gate of the transistor Tr55 is connected to the gate of the transistor Tr47. Thus, the gate voltage of the transistor Tr55 is provided as the control signal CL4 to the gate of the transistor Tr47, and the transistors Tr55 and Tr47 perform a current mirror operation.

When the operation current Inr2 flows through the transistor Tr49 in response to the input signal Vin2, the current mirror operation of the transistors Tr51 and Tr54 cause the same operation current Inr2 to flow through the transistor Tr55. Then, the current mirror operation of the transistors Tr55 and Tr47 cause operation current Inc2, which is substantially the same as the operation current Inr2, to flow through the transistor Tr47.

The transistors Tr50 and Tr51 function as an offset current generation circuit, and the control signal generation circuit 11b excluding the transistors Tr50 and Tr51, that is, the transistors Tr48, Tr49, and Tr52 to Tr55 function as an offset current supplying circuit together with the transistors Tr46 and Tr47.

The operation of the differential amplifier 400 will now be discussed.

When the center voltage of the input signals Vin1 and Vin2 is at the intermediate level between the power supply VDD and the power supply Vss, the input differential pair configured by the transistors Tr1 and Tr2 and the input differential pair configured by the transistors Tr3 and Tr4 operate in a saturated state. Further, the operation currents In1 and In2 of the transistors Tr1 and Tr2 and the operation currents Ip1 and Ip2 of the transistors Tr3 and Tr4 are saturated.

In this state, the operation currents Inr1 and Inr2 respectively flowing through the transistors Tr48 and Tr49 become saturated currents, and the same operation currents Inr1 and Inr2 respectively flow through the transistors Tr53 and Tr55. As a result, the same operation currents Inc1 and Inc2 (offset current) respectively flow through the transistors Tr47 and Tr46. The operation currents Inc1 and Inc2 are substantially the same as the operation currents Ip1 and Ip2 respectively flowing through the transistors Tr3 and Tr4. This decreases the potential at the gates of the transistors Tr40 and Tr41 and the gates of the transistors Tr42 and Tr43. Thus, drain current does not flow through each of the transistors. As a result, only the operation current In1, which flows through the transistor Tr1, flows as the output current Io1 through the transistor Tr44. Further, only the operation current In2, which flows through the transistor Tr2, flows as the output current Io2 through the transistor Tr45.

When the center voltage of the input signals Vin1 and Vin2 increases and becomes greater than the intermediate level between the power supply VDD and the power supply Vss, the transistors Tr48 and Tr49 are maintained in a saturation range, currents substantially equal to the currents Ip1 and Ip2 flow through the transistors Tr46 and Tr47, and null operation current flows through the transistors Tr41 and Tr43. Accordingly, only the operation current In1, which flows through the transistor Tr1, flows as the output current Io1 through the transistor Tr44. Further, only the operation current In2, which flows through the transistor Tr2, flows as the output current Io2 through the transistor Tr45.

When the center voltage of the input signals Vin1 and Vin2 becomes less than the intermediate level between the power supply VDD and the power supply Vss and the transistors Tr48 and Tr49 are operated in a non-saturation range, the transistors Tr3 and Tr4 are operated in a saturation range. As a result, operation currents Inr1 and Inr2 (i.e., operation currents Inc1 and Inc2), which are smaller than the operation currents Ip1 and Ip2 of the transistors Tr3 and Tr4, respectively flow through the transistors Tr48 and Tr49 (i.e., the transistors Tr46 and Tr47). Therefore, operation current (Ip1-Inc1) flows through the transistors Tr41, and operation current (Ip2-Inc2) flows through the transistor Tr43. Further, the operation currents In1 and In2 of the transistors Tr1 and Tr2 become substantially equal to the operation currents Inc1 and Inc2, respectively. Accordingly, only the current that corresponds to the operation current Ip1 flowing through the transistor Tr3 flows as the output current Io1 through the transistor Tr44. Further, only the current that corresponds to the operation current Ip2 flowing through the transistor Tr4 flows as the output current Io2 through the transistor Tr45.

Due to such operations, the differential amplifier 400 has the same advantages as the differential amplifier 300 of the first embodiment.

It should be apparent to those skilled in the art that the present invention may be embodied in many other specific forms without departing from the spirit or scope of the invention. Particularly, the differential amplifiers 300 and 400 of the above embodiments may be configured by bipolar transistors. Therefore, the present examples and embodiments are to be considered as illustrative and not restrictive, and the invention is not to be limited to the details given herein, but may be modified within the scope and equivalence of the appended claims.

What is claimed is:

1. A differential amplifier comprising:
    a first differential circuit for generating a first operation current in response to an input signal;
    a second differential circuit for generating a second operation current in response to the input signal;
    a current synthesizing circuit, connected to the first and second differential circuits, for synthesizing the first and second operation currents and generating output voltage; and
    an output current offset circuit, connected to the current synthesizing circuit, for offsetting a current corresponding to one of the first and second operation currents based on the input signal.

2. The differential amplifier according to claim 1, wherein the first differential circuit generates the first operation current when the input signal is greater than or equal to an intermediate level between power supply voltages supplied to the differential amplifier, and the second differential circuit generates the second operation current when the input signal is less than or equal to the intermediate level between the power supply voltages.

3. The differential amplifier according to claim 2, wherein the output current offset circuit offsets current corresponding to the first operation current when the input signal is at the intermediate level.

4. The differential amplifier according to claim 2, wherein the output current offset circuit offsets current corresponding to the second operation current when the input signal is at the intermediate level.

5. The differential amplifier according to claim 1, wherein the current synthesizing circuit includes:
    an output transistor connected to one of the first and second differential circuits; and
    a first current mirror circuit, connected to the other one of the first and second differential circuits and to the output transistor, for generating a first current mirror current corresponding to the operation current of the other one of the first and second differential circuits; and the output current offset circuit includes:

an offset current generation circuit for generating offset current that is substantially equivalent to the operation current of the one of the first and second differential circuits based on the input signal; and an offset current supplying circuit, connected to the offset current generation circuit and the first current mirror circuit, for supplying the offset current to the other one of the first and second differential circuits and offsetting the first current mirror current of the first current mirror circuit with the offset current.

6. The differential amplifier according to claim 5, wherein the offset current generation circuit includes a differential circuit having a configuration that is substantially the same as that of the one of the first and second differential circuits.

7. The differential amplifier according to claim 5, wherein the one of the first and second differential circuits is the second differential circuit, and the other one of the first and second differential circuits is the first differential circuit, the first differential circuit including a pair of n-channel MOS transistors, each having a gate for receiving the input signal, the second differential circuit including a pair of first p-channel MOS transistors, each having a gate for receiving the input signal, the offset current generation circuit including a pair of second p-channel MOS transistors, each having substantially the same size as the pair of first p-channel MOS transistors, for generating the offset current, and the offset current supplying circuit including a second current mirror circuit for supplying the first differential circuit with a second current mirror current corresponding to the offset current to offset at least part of the first current mirror current of the first current mirror circuit with the second current mirror current.

8. The differential amplifier according to claim 5, wherein the one of the first and second differential circuits is the first differential circuit, and the other one of the first and second differential circuits is the second differential circuit, the first differential circuit including a pair of first n-channel MOS transistors, each having a gate for receiving the input signal, the second differential circuit including a pair of p-channel MOS transistors, each having a gate for receiving the input signal, the offset current generation circuit including a pair of second n-channel MOS transistors, each having substantially the same size as the pair of first n-channel MOS transistors, for generating the offset current, the offset current supplying circuit including a second current mirror circuit for supplying the second differential circuit with a second current mirror current corresponding to the offset current to offset at least part of the first current mirror current of the first current mirror circuit with the second current mirror current.

9. The differential amplifier according to claim 5, wherein the one of the first and second differential circuits is the second differential circuit, and the other one of the first and second differential circuits is the first differential circuit, the first differential circuit including a pair of n-channel MOS transistors, each having a gate for receiving the input signal, the second differential circuit including a pair of first p-channel MOS transistors, each having a gate for receiving the input signal, the current synthesizing circuit including a pair of second n-channel MOS transistors connected between the pair of first p-channel MOS transistors and a low potential power supply, the first current mirror circuit including two sets of third p-channel MOS transistors respectively connected to the pair of n-channel MOS transistors, the offset current generation circuit including a pair of fourth p-channel MOS transistors, each having substantially the same size as the pair of first p-channel MOS transistors, for generating the offset current, the offset current supplying circuit including a second current mirror circuit for supplying the first differential circuit with a second current mirror current corresponding to the offset current to offset at least part of the first current mirror current of the first current mirror circuit with the second current mirror current.

10. The differential amplifier according to claim 5, wherein the one of the first and second differential circuits is the first differential circuit, and the other one of the first and second differential circuits is the second differential circuit, the first differential circuit including a pair of first n-channel MOS transistors, each having a gate for receiving the input signal, the second differential circuit including a pair of first p-channel MOS transistors, each having a gate for receiving the input signal, the current synthesizing circuit including a pair of second p-channel MOS transistors connected between the pair of first n-channel MOS transistors and a high potential power supply, the first current mirror circuit including two sets of third p-channel MOS transistors respectively connected to the pair of first p-channel MOS transistors, the offset current generation circuit including a pair of second n-channel MOS transistors, each having substantially the same size as the pair of first n-channel MOS transistors, for generating the offset current, the offset current supplying circuit including a second current mirror circuit for supplying the second differential circuit with a second current mirror current corresponding to the offset current to offset at least part of the first current mirror current of the first current mirror circuit with the second current mirror current.

11. A differential amplifier comprising:

a first differential circuit for generating a first operation current in response to an input signal;

a second differential circuit for generating a second operation current in response to the input signal;

a current synthesizing circuit, connected to the first and second differential circuits, for synthesizing the first and second operation currents and generating output voltage;

a third differential circuit for generating a third operation current corresponding to the second operation current in response to the input signal; and a current supplying circuit, connected to the first differential circuit and the third differential circuit, for supplying the first differential circuit with the third operation current and offsetting the first operation current with the third operation current.

12. The differential amplifier according to claim 11, wherein the second differential circuit has a configuration that is substantially the same as that of the third differential circuit.

13. The differential amplifier according to claim 11, wherein the first differential circuit generates the first operation current when the input signal is greater than or equal to an intermediate level between power supply voltages supplied to the differential amplifier, the second differential circuit generates the second operation current when the input signal is less than or equal to the intermediate level between the power supply voltages, and the current supplying circuit offsets the first operation current with the third operation current when the input signal is at the intermediate level.

14. The differential amplifier according to claim 11, wherein the current synthesizing circuit includes:

an output transistor connected to the second differential circuit; and a first current mirror circuit, connected to the first differential circuit and to the output transistor, for generating a first current mirror current corresponding to the first operation current; and the current supply circuit includes:

a second current mirror circuit, connected to the third differential circuit and the first current mirror circuit, for supplying the first differential circuit with second current mirror current corresponding to the third operation current and offsetting the first current mirror current of the first current mirror circuit with the second current mirror current.

15. A differential amplifier comprising:

a first differential circuit for generating a first operation current in response to an input signal;

a second differential circuit for generating a second operation current in response to the input signal;

a current synthesizing circuit, connected to the first and second differential circuits, for synthesizing the first and second operation currents and generating output voltage;

a third differential circuit for generating a third operation current corresponding to the first operation current in response to the input signal; and a current supplying circuit, connected to the second differential circuit and the third differential circuit, for supplying the second differential circuit with the third operation current and offsetting the second operation current with the third operation current.

16. The differential amplifier according to claim 15, wherein the first differential circuit has a configuration that is substantially the same as that of the third differential circuit.

17. The differential amplifier according to claim 15, wherein the first differential circuit generates the first operation current when the input signal is greater than or equal to an intermediate level between power supply voltages supplied to the differential amplifier, the second differential circuit generates the second operation current when the input signal is less than or equal to the intermediate level between the power supply voltages, and the current supplying circuit offsets the second operation current with the third operation current when the input signal is at the intermediate level.

18. The differential amplifier according to claim 15, wherein the current synthesizing circuit includes:

an output transistor connected to the first differential circuit; and a first current mirror circuit, connected to the second differential circuit and to the output transistor, for generating a first current mirror current corresponding to the second operation current; and the current supply circuit includes:

a second current mirror circuit, connected to the third differential circuit and the first current mirror circuit, for supplying the second differential circuit with a second current mirror current corresponding to the third operation current and offsetting the first current mirror current of the first current mirror circuit with the second current mirror current.

19. A semiconductor device comprising:

a differential amplifier for amplifying an input signal, the differential amplifier including:

a first differential circuit for generating a first operation current in response to the input signal;

a second differential circuit for generating a second operation current in response to the input signal;

a current synthesizing circuit, connected to the first and second differential circuits, for synthesizing the first and second operation currents and generating output voltage; and an output current offset circuit, connected to the current synthesizing circuit, for offsetting a current corresponding to one of the first and second operation currents based on the input signal.

20. A semiconductor device comprising:

a differential amplifier for amplifying an input signal, the differential amplifier including:

a first differential circuit for generating a first operation current in response to the input signal;

a second differential circuit for generating a second operation current in response to the input signal;

a current synthesizing circuit, connected to the first and second differential circuits, for synthesizing the first and second operation currents and generating output voltage;

a third differential circuit for generating a third operation current corresponding to the second operation current in response to the input signal; and a current supplying circuit, connected to the first differential circuit and the third differential circuit, for supplying the first differential circuit with the third operation current and offsetting the first operation current with the third operation current.

21. A semiconductor device comprising:

a differential amplifier for amplifying an input signal, the differential amplifier including:

a first differential circuit for generating a first operation current in response to the input signal;

a second differential circuit for generating a second operation current in response to the input signal;

a current synthesizing circuit, connected to the first and second differential circuits, for synthesizing the first and second operation currents and generating output voltage;

a third differential circuit for generating a third operation current corresponding to the first operation current in response to the input signal; and a current supplying circuit, connected to the second differential circuit and the third differential circuit, for supplying the second differential circuit with the third operation current and offsetting the second operation current with the third operation current.

* * * * *